United States Patent
Krejci et al.

(10) Patent No.: US 8,320,419 B2
(45) Date of Patent: Nov. 27, 2012

(54) HIGH POWER SEMICONDUCTOR LASER DIODES

(75) Inventors: Martin Krejci, Zürich (CH); Norbert Lichtenstein, Langnau am Albis (CH); Stefan Weiss, Langnau am Albis (CH); Julien Boucart, Zürich (CH); René Todt, Adliswil (CH)

(73) Assignee: Oclaro Technology Limited, Northamptonshire (GB)

( * ) Notice: Subject to any disclaimer, the term of this patent is extended or adjusted under 35 U.S.C. 154(b) by 157 days.

(21) Appl. No.: 12/873,382

(22) Filed: Sep. 1, 2010

(65) Prior Publication Data
US 2011/0051758 A1   Mar. 3, 2011

Related U.S. Application Data

(63) Continuation-in-part of application No. 12/233,658, filed on Sep. 19, 2008, now abandoned.

(60) Provisional application No. 60/973,936, filed on Sep. 20, 2007.

(51) Int. Cl.
*H01S 3/04* (2006.01)
(52) U.S. Cl. ............ 372/34; 372/36; 372/50.12; 372/66
(58) Field of Classification Search ............ 372/34, 372/36, 50.12
See application file for complete search history.

(56) References Cited

U.S. PATENT DOCUMENTS

| | | | |
|---|---|---|---|
| 5,848,082 A * | 12/1998 | Shum | 372/36 |
| 5,848,083 A | 12/1998 | Haden et al. | |
| 2008/0037601 A1 * | 2/2008 | Nielsen | 372/34 |

OTHER PUBLICATIONS

Tomm et al., "Spectroscopic strain measurement methodology: Degree-of-polarization photoluminescence versus photo current spectroscopy", Applied Physics Letters, 88, 133504, 2006.

* cited by examiner

*Primary Examiner* — Dung Nguyen
(74) *Attorney, Agent, or Firm* — Patterson & Sheridan, L.L.P.

(57) ABSTRACT

A high power laser source comprises a bar of laser diodes having a first coefficient of thermal expansion $CTE_{bar}$ on a submount having a second coefficient $CTE_{sub}$ and a cooler having a third coefficient $CTE_{cool}$. The submount/cooler assembly shows an effective fourth coefficient $CTE_{eff}$ differing from $CTE_{bar}$. This difference leads to a deformation of the crystal lattice of the lasers' active regions by mechanical stress. $CTE_{eff}$ is selected to be either lower than both $CTE_{bar}$ and $CTE_{cool}$ or is selected to be between $CTE_{bar}$ and $CTE_{cool}$. The submount may either comprise layers of materials having different CTEs, e.g., a Cu layer of 10-40 μm thickness and a Mo layer of 100-400 μm thickness, or a single material with a varying $CTE_{sub}$. Both result in a $CTE_{sub}$ varying across the submount's thickness.

13 Claims, 13 Drawing Sheets

Figure 1B:
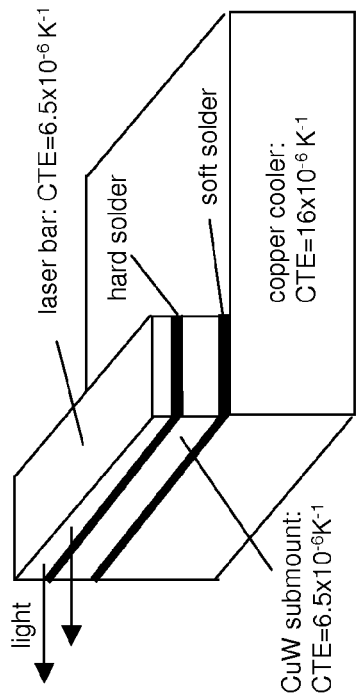

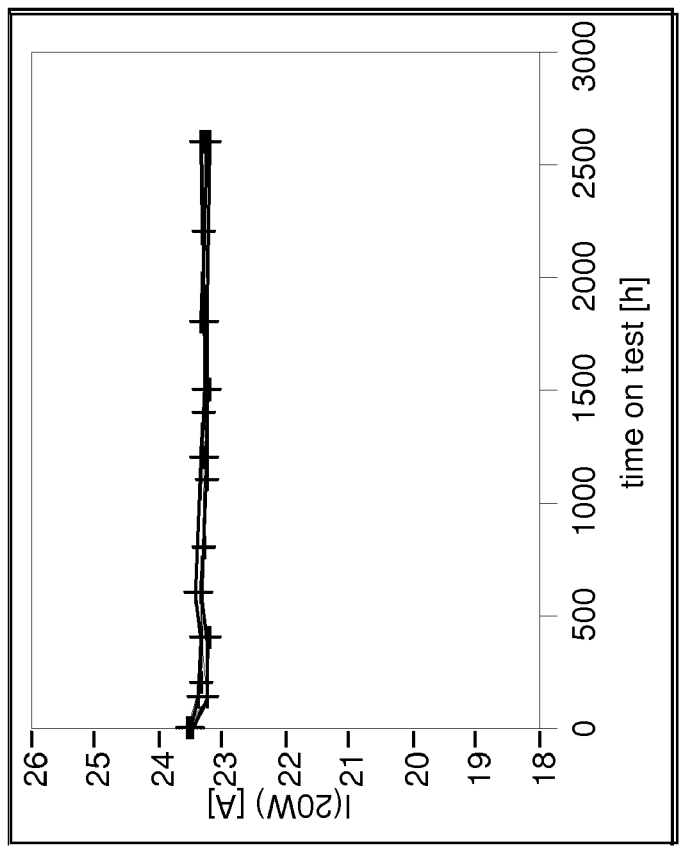
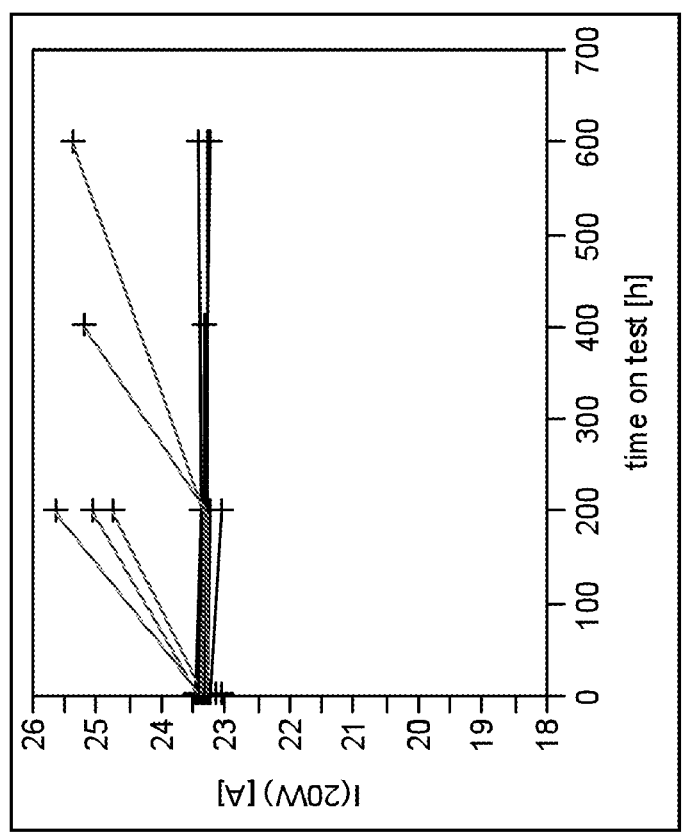
Fig. 9b
Fig. 9a

HIGH POWER SEMICONDUCTOR LASER DIODES

CROSS-REFERENCE TO RELATED APPLICATION

This application is a Continuation-in-Part of U.S. patent application Ser. No. 12/233,658 filed on Sep. 18, 2008, which claims priority to U.S. Application No. 60/973,936 filed on Sep. 20, 2007, the entire disclosures of which are incorporated herein by reference.

FIELD OF THE INVENTION

The present invention relates to semiconductor high power laser diode devices, in particular to the cooling system of broad-area single-emitter (BASE) laser diode devices. They include laser diodes arranged in a bar structure of up to 30 and more diodes and are now commonly used in many industrial applications. Such a laser device may produce 100 W or more of light power, each of the laser diodes producing at least 10 mW output. At powers of this magnitude, it is important to manage heat dissipation in order to achieve good product performance and lifetime. Usually, such a laser diode bar is arranged on a submount, mostly junction side down, which submount transfers the heat of the laser bar to a cooling system. Mechanical stress, introduced to the laser diode bar as a result of the assembly on a cooling platform, has a significant influence on fundamental device properties such as reliability, polarization purity, spectral width, and curvature of the horizontal light emission line, so-called "smile". The present invention addresses the adjustment of the assembly to the laser bar properties by submount design.

BACKGROUND AND PRIOR ART

Today, one major problem when manufacturing industrial laser bars is the large mismatch in thermal expansion coefficient (CTE) between the commonly used laser diodes and the cooler. For example, GaAs-based laser diode bars have a $CTE=6.5\times10^{-6}$ $K^{-1}$, whereas the usual copper cooler has a $CTE=16\times10^{-6}$ $K^{-1}$.

There are three common mounting technologies for industrial laser bars on copper coolers:
(1) The laser bar is directly attached to the copper cooler using a "soft solder", e.g. In, InAg, or InSn.
(2) The laser bar is attached to a "CTE-matched" CuW submount, consisting e.g. of a homogenized 10% Cu and 90% W submount, forming a bar-on-submount structure (BoS), using a "hard solder", e.g. AuSn, and then
   (2a) mounting the BoS on the copper cooler using a "soft solder", e.g. In, InAg, or InSn, or
   (2b) mounting the BoS on the cooper cooler using a "hard solder", e.g. AuSn, SnAgCu, or PbSn.

For the following reasons, none of these three mounting technologies results in a satisfactory assembly for industrial laser bars:

One reason is the insufficient stability of the solder interface which results in an unsatisfactory reliability. A drawback of "soft" (i.e. low melting point) solders is their instability under thermal cycling operation, e.g. on-off operation common in industrial laser applications. As a consequence, with the mounting technologies described in (1) and (2a) above, the limiting operating condition is not determined by the properties of the laser diodes, but by the poor stability of the solder interfaces. Tests have shown that for one particular diode design, the maximum drive current for a reliable operation is about 90 A when using the mounting technology (1), i.e. direct mounting the diode onto the copper cooler using In. For the technology (2a), the maximum drive current is 120 A, i.e. mounting the BoS on the copper cooler using InAg. When using hard solder only as described in (2b), it is 180 A. As a consequence, "soft solder" technologies seem to be no option for future industrial laser bar generations to meet the market requirement of a very high optical output power.

For the temperature-induced deformation of a laser bar caused by the temperature difference between the mounting condition and the use condition on or with its mount or submount, persons skilled in the art use the term "smile" as a descriptor because of its appearance. "Smile" of a laser device in this context is defined as the warping or curvature or bow of a laser device along the length of the laser diode bar which is in the plane orthogonal to the emitted light beam, i.e. orthogonal to the emitted light beam. Thus, looking head-on into the light-emitting facets of the laser diodes of the bar, the various facets do not form a straight line. Smile is generally believed to result from stress and the term is often used to imply that the device has been subject to thermal stress.

Because technology (1) avoids a submount, it allows the design of devices with better thermal conductivity than comparable devices using the technologies (2a) and (2b). Also, because of the low solder temperature and the ductility of the soft solder, devices assembled using this technology have low bow values, i.e. <2 μm. Further, vertically stacked laser bar arrays for very high power output may be made smaller, thus enabling better and easier vertical collimation of the laser beam by lenses or other optical means.

However, as mentioned above, the limited reliability of soft-soldered devices in off-on operation is an important drawback of this technology.

Technology (2a) uses a submount which is CTE-matched to the laser bar and a ductile soft solder between the various parts. This results in low-bow and low-stress devices. Further, such devices are significantly more reliable than comparable devices assembled with technology (1). This behavior is based on the fact that, because of the missing submount in technology (1), the soft In-based solder interface is close to the light/heat-generating region responsible for thermal and thermo-mechanical driving forces, which, for an on-off operation mode, cause a degradation of soft-solder interfaces. These driving forces are directly correlated to the spatio-temporal temperature distribution in the solder interface. Because of the thermal spreading within the submount, the temperature distribution is more homogeneous for technology (2a) than for technology (1), where there is no submount acting as a heat spreader between the heat-generating region and the soft solder interface. Nevertheless, the maximum reliable operation power of devices assembled using technology (2a) is in many cases determined by the stability of the soft solder interface. "Hard solder" assembly technologies avoid this problem and achieve more reliable operation of high power devices.

Technology (2b) offers such a pure hard solder assembly. The CuW submount, having a thermal expansion coefficient ($CTE_{sub}$) equal or close to the thermal expansion coefficient ($CTE_{bar}$) of the laser bar, acts as a stress buffer between the copper cooler and the laser bar. Nevertheless, the limitation of the thermal expansion coefficient to a narrow region centered at $6.5\times10^{-6}K^{-1}$ often leads to non-optimized device characteristics, such as high smile values, undefined spectral shape or poor polarization purity.

Further, stress within and the often resulting smile of a laser device have a significant impact on the reliability. For some devices, e.g. devices having a stress-sensitive epitaxial structure, technology (2b) often leads to reliability problems, because e.g. a hard solder and a CuW submount are unable to compensate the uncontrolled compressive stress in the device caused by the thermal mismatch between the laser/submount and the cooler.

Also, to control the CTE-mismatch between diode and cooler, so-called CTE-matched coolers have been developed. Known technologies for CTE-matched coolers are:

CuMoCu micro channel coolers;
Cu—AlN micro channel coolers; and
Al—C (nanotubes) passive coolers.

Although these coolers are technically quite advanced, they have some disadvantages:

they are expensive and are therefore used only for demonstration or "niche" applications;
some users expect cooler reliability problems and therefore hesitate to switch to a CTE-matched cooler; and/or
the thermal conductivity of the CTE-matched coolers is in general not as good as the thermal conductivity of a copper cooler with the same geometry.

Also, layered submounts have been developed to obtain a better match between the laser diode bar and the cooler, i.e. these layered submounts aim to match the $CTE_{bar}$ of the laser bar to reduce the stress to the latter. This may seem to solve the problem but it does not. The reason is that the application of heat when soldering the laser bar to the layered submount inevitably introduces uncontrolled stress.

A specific example of a high power laser mounting module discloses Haden in U.S. Pat. No. 5,848,083. This module includes a bulk layer with stress-relief apertures and consists of at least two components: a mounting plate and a multi-layer heat transfer component. The cooler is mounted to the mounting plate. Apart from being rather complex and thus costly, the main object of Haden's design is to produce an "expansion-matched, stress-relieved" module with high thermal conductivity. The CTE of this design is said to be "substantially equal" to the CTE of the "heat dissipating element", i.e. the laser bar. In other words, Haden discloses an approach equivalent to the type (2b) technology described above.

However, all prior art solutions are focused on the avoidance or minimization of stress in the laser bar and address potential solutions therefore. To summarize, despite the various partial solutions for the stress problem of laser diode bar devices, there is still a need for a simple, cost-effective design of such devices.

The Invention

It seems that one specific point is overlooked by the solutions disclosed in the prior art. The following invention overcomes the problems remaining when using the prior art.

As mentioned above, the prior art solutions and approaches aim at reducing or avoiding mechanical stress to the laser bar. They do not even consider that a controlled stress exerted to the laser bar in the final device may improve the quality of the optical output and/or the reliability. In other words, stress in the assembled laser device may be an advantage—not a problem. The present invention focuses on defining mechanical properties of the substructure, essentially of the submount and the cooler, such that the stress in the assembled laser device is not minimized, but is adjusted to the requirements and properties of the laser device.

This approach generates a greater degree of freedom for the design of laser devices because the laser assembly solutions described in the prior art pre-define the compatibility between laser properties and assembly stress and therefore limit the choice of parameters for e.g. epitaxial design, metallization, or dielectric layers.

For describing the stress in the light emitting region of a laser bar, a parameter called $CTE_{eff}$ is introduced. This parameter describes the mechanical impact of submount and cooler, i.e. the submount cooler assembly, on the assembled bar. Based on Finite Element Modeling investigations, a linear relation between $CTE_{eff}$ and the engineering strain $\Delta a/a$ of the light emitting semiconductor region was established. A typical value is $\Delta a/a = 0.0001$ (i.e. 0.01% assembly strain) for a $CTE_{eff}$ deviating by 5% from $CTE_{bar}$. X-ray diffraction or spectroscopic methods such as photoluminescence or photocurrent spectroscopy are suitable to quantify the engineering strain in the light emitting region with the required resolution and sensitivity as described by Jens W. Tomm, Tran Quoc Tien, and Daniel T. Cassidy in APPLIED PHYSICS LETTERS 88, 133504, 2006.

To achieve such a "strained laser bar device", a submount/cooler assembly is produced whose $CTE_{eff}$ differs from the $CTE_{bar}$ in a particular way as will be explained below. This is just the opposite of most mainstream approaches, which consist in producing a substructure, e.g. a submount/cooler assembly, whose CTE is as close as possible or equal to the $CTE_{bar}$ or which use a ductile solder to compensate for the CTE mismatch between the laser bar and the substructure.

In brief, the invention is a laser source with the various coefficients of thermal expansion $CTE_{bar}$, $CTE_{sub}$, $CTE_{cool}$, and $CTE_{eff}$ as defined above whose laser bar is intentionally stressed. More precisely, its laser bar's semiconductor crystal lattice is deformed by mechanical stress executed upon said laser bar by the submount/cooler assembly.

This stress is preferably produced by choosing a submount/cooler assembly with a $CTE_{eff}$ different from the laser bar's $CTE_{bar}$, $CTE_{eff} \neq CTE_{bar}$. It was found that a minimum CTE difference of 5% effects a deformation of the crystal lattice of about 0.01%. However, the $CTE_{eff}$ may differ much more from $CTE_{bar}$, e.g. up to 100%.

Thereby, $CTE_{sub}$ may be selected higher than said first coefficient $CTE_{bar}$ and smaller than or equal to said third coefficient ($CTE_{cool}$), in short: $CTE_{sub} > CTE_{bar}$ and $CTE_{sub} \leq CTE_{cool}$.

Alternatively $CTE_{sub}$ may be selected less than both $CTE_{bar}$ and $CTE_{cool}$, in short: $CTE_{sub} < CTE_{bar}$ and $CTE_{sub} < CTE_{cool}$.

A method for making a high power laser source according to the invention includes choosing $CTE_{eff}$ different by a predetermined amount from $CTE_{bar}$, $CTE_{eff} \neq CTE_{bar}$, hard soldering the bar of laser diodes to the submount and also hard soldering said submount to said cooling element. Thereby the laser bar's active region is stressed which produces a deformation of its semiconductor crystal lattice.

More features of the invention are disclosed in the following description of details and embodiments and in the claims.

This means that the present invention uses an approach totally different from the prior art in that it intentionally exerts stress to the laser bar and, by positively controlling and/or adjusting this stress, thereby improves the laser device.

This may be effected by selecting the $CTE_{sub}$ of the submount and the $CTE_{cool}$ of the cooling element such that the $CTE_{eff}$ of the submount/cooler assembly deviates from the $CTE_{bar}$ of the laser bar by a certain amount or percentage. More precisely, the $CTE_{eff}$ of the submount/cooler assembly can be selected either larger or smaller than the $CTE_{bar}$ of the laser bar. By choosing the suitable difference between $CTE_{bar}$ and $CTE_{eff}$, either positive or negative, a "stress-adjusted" laser device with optimal properties is achieved. It should be noted that the stress exerted on the laser bar may be either compressive or tensile. The following examples explain this inventive concept and present general rules for implementing the invention. More detailed embodiments are described together with the drawings.

With a given $CTE_{bar}$ of the laser bar, there are two ways for selecting the $CTE_{sub}$ of the submount and the $CTE_{cool}$ of the cooling element:

either selecting $CTE_{sub} > CTE_{bar}$ and $CTE_{sub} \leqq CTE_{cool}$, or selecting $CTE_{sub} < CTE_{bar}$ and $CTE_{sub} < CTE_{cool}$. In both cases, the resulting $CTE_{eff}$ of the submount/cooler assembly must differ from the $CTE_{bar}$ by at least 5%. The upper limit may be 100%, i.e. for a particular design an optimal $CTE_{eff}$ of the submount/cooler assembly may be twice or half the $CTE_{bar}$.

Selecting the various CTE values according to these basic inventive rules results in a stress-adjusted high power laser device. The examples described below illustrate details of such optimal designs.

Typically, a high power diode bar has a $CTE_{bar}$ much lower than that of the cooler. As mentioned above, a GaAs diode bar has a $CTE_{bar} = 6.5 \times 10^{-6} K^{-1}$ compared with a usual copper cooler with $CTE_{cool} = 16 \times 10^{-6} K^{-1}$.

The invention requires, of course, a selection of materials and thicknesses of the components used. Since the material of the laser diode bar is usually selected according to the desired output (power and frequency) and the material of the cooler is often given by design restriction or customer requirement, only the material of the submount can be selected according to its thermal and mechanical properties.

As explained above, according to this invention, the submount, its CTE and/or structure is tailored in such a way that, in the final assembly, the submount exhibits a predetermined force on the mounted laser diode bar, i.e. the laser bar is stressed or preloaded in the final device.

A particular feature is to design the submount as a layered structure, e.g. as CuMoCu structure. Although layered submounts are not new per se, they have not been pre-stressed or preloaded according to the invention until now.

A further feature is to design such a layered submount advantageously asymmetrically, e.g. as a MoCu layer with the Cu layer facing the cooler or as a CuMoCu sandwich with two Cu layers of differing thicknesses, the thicker Cu layer facing the cooler.

Another particular feature of this invention is to provide a laser/submount subunit which is pre-stressed, e.g. already bent, i.e. shows a smile. This may be done by bending the submount before soldering, e.g. by an asymmetric design of the submount, in which case the submount consists of a vertically asymmetric arrangement of layers with different CTEs. Pre-bending may also be accomplished by mechanical means before or during assembly, e.g. by optimizing the curvature of solder tools (thermode/base plate, stamps).

As a result of this new approach of submount design is that it allows the mounting of laser diode bars using hard solder technologies on any submounts, especially of InGaAlAs-based laser bars on copper or other coolers with similar CTEs. This results in the following benefits and advantages:

defined stress in the active region of the lasers which results in high reliability of the laser device, precise spectral width, and high polarization purity;
low smile values, i.e. minimum deformation, which results in better beam shaping and better coupling to the usual wave guide;
stable solder interfaces which again improves the reliability of the laser device.

This altogether provide much greater freedom for the design of laser devices than prior art approaches and allows to increase the rated output power of laser devices without introducing smile or poor reliability or undesired optical behavior.

DETAILED DESCRIPTION OF PREFERRED EMBODIMENTS

Figure 1A:
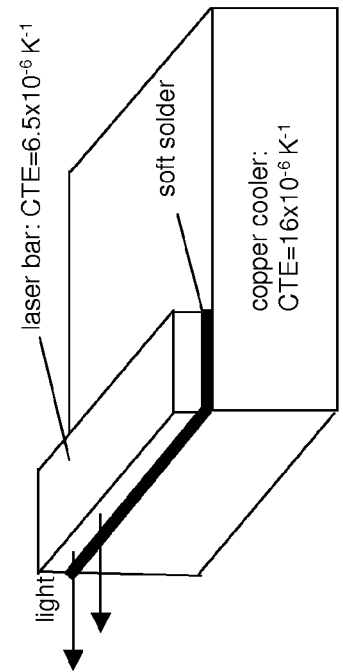
Figure 1D:
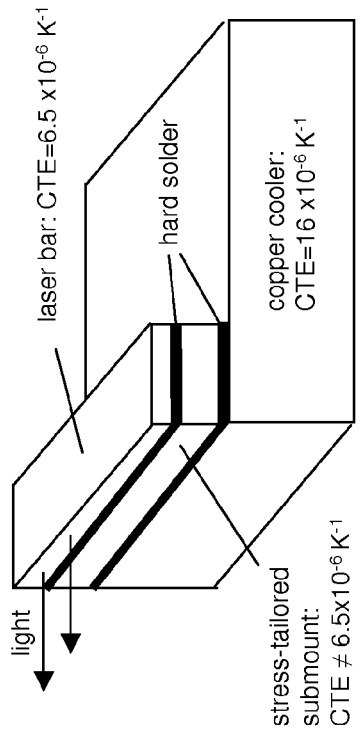
Figure 1C:
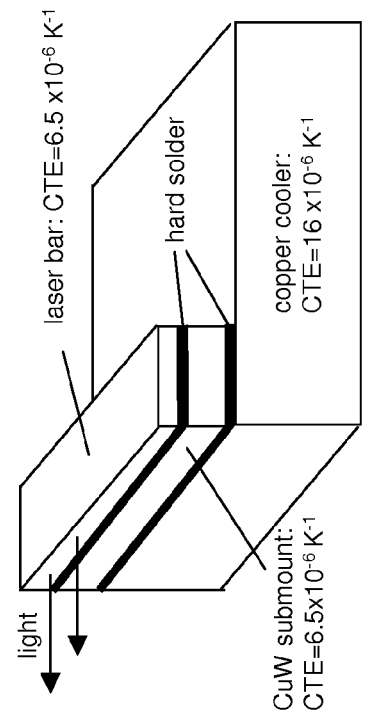
Figure 2:
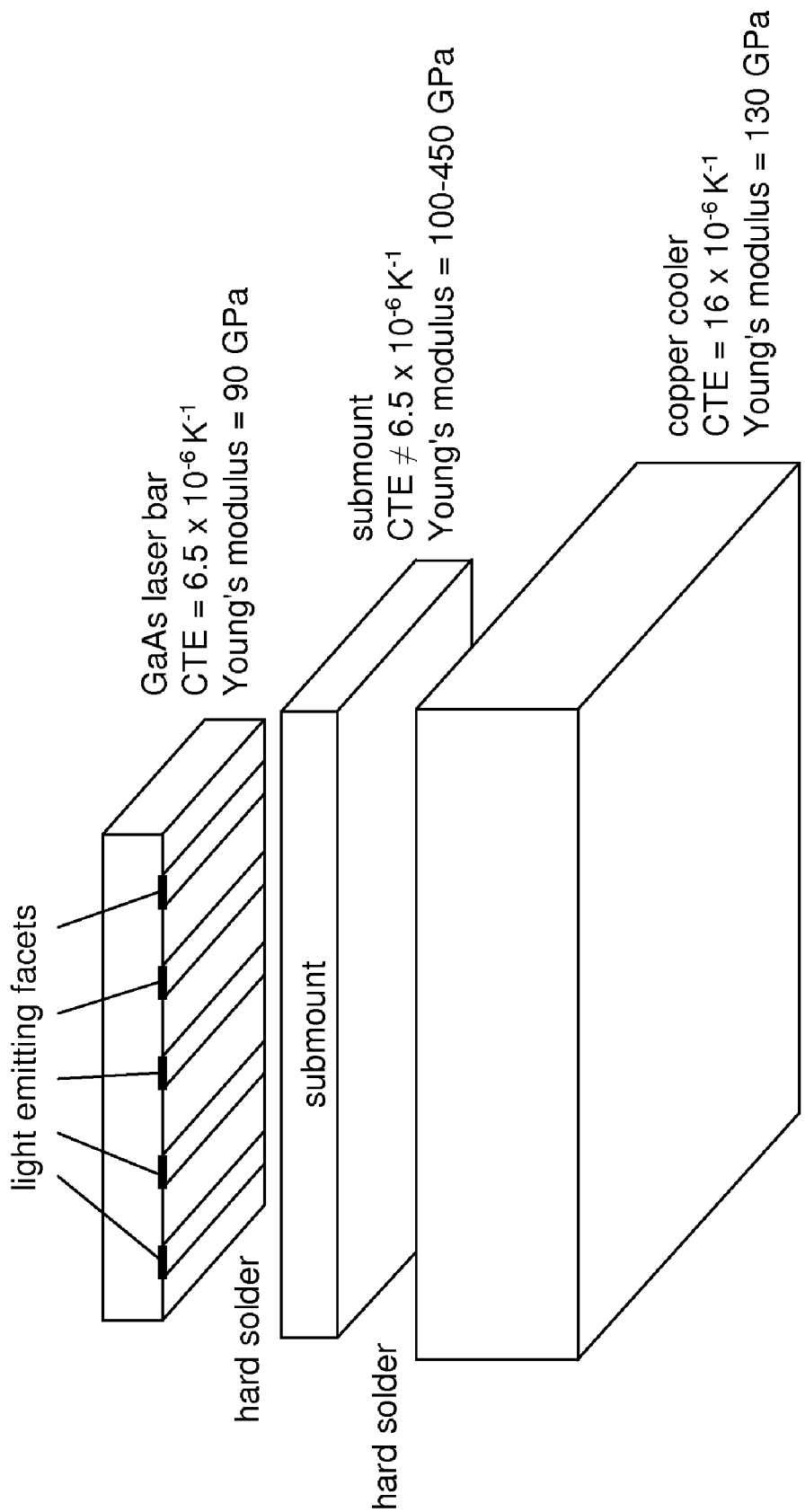
Figure 3:
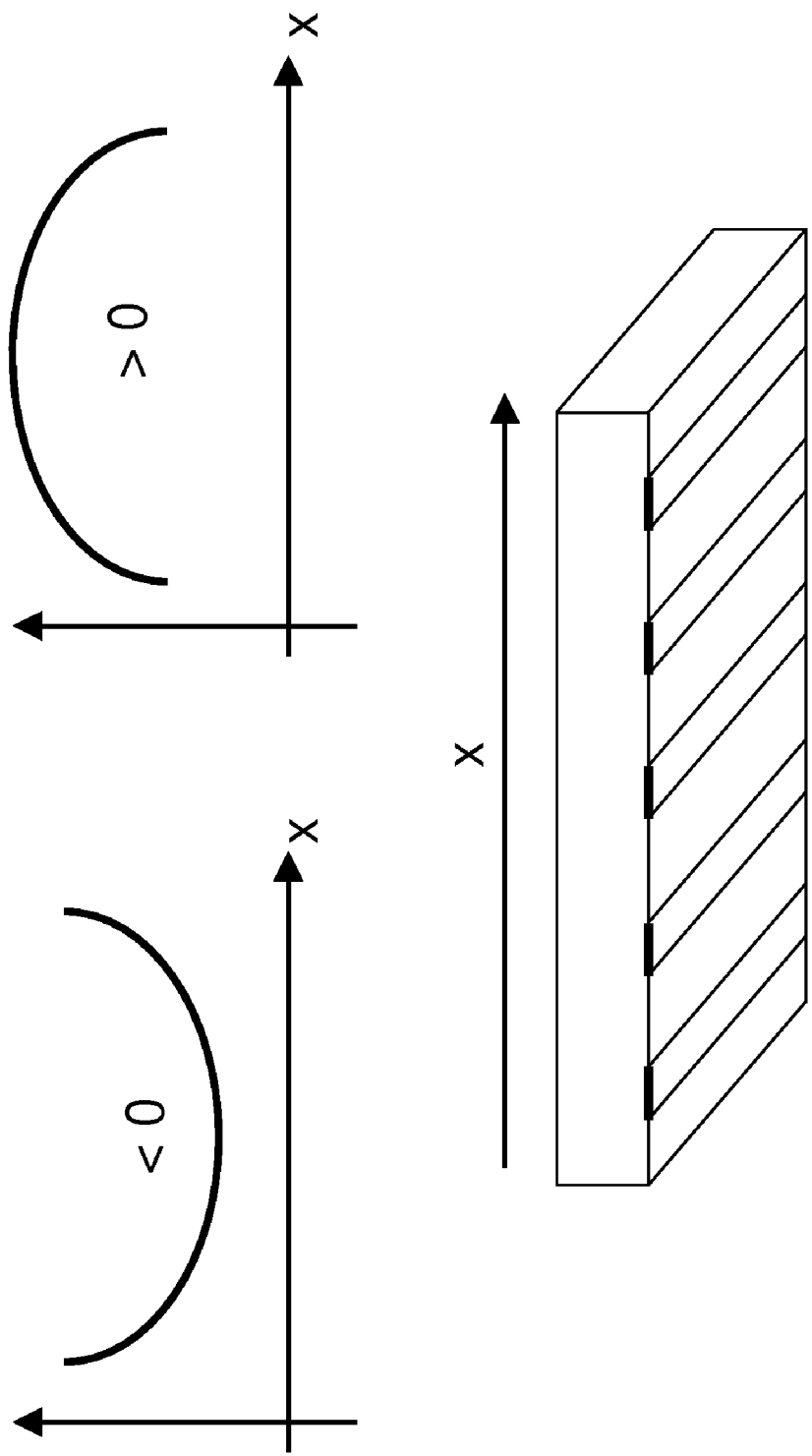
Figure 4:
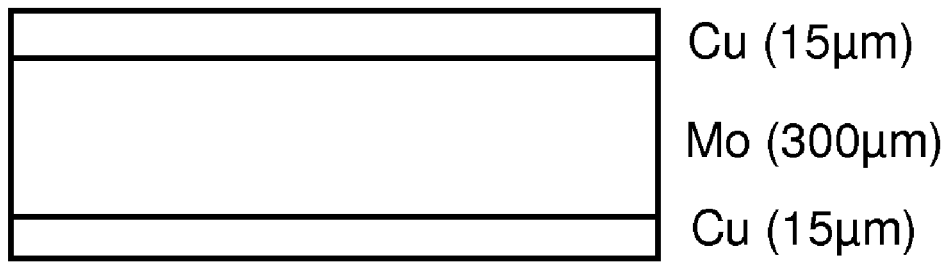
Figure 5:
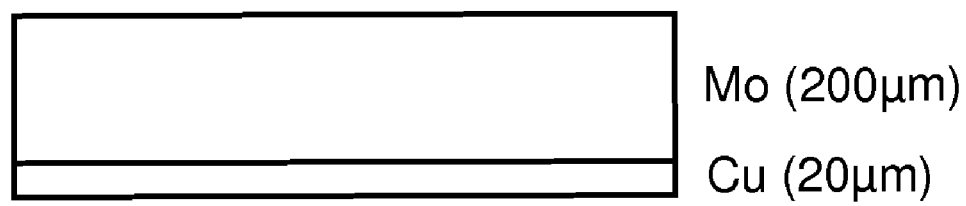
Figure 6:
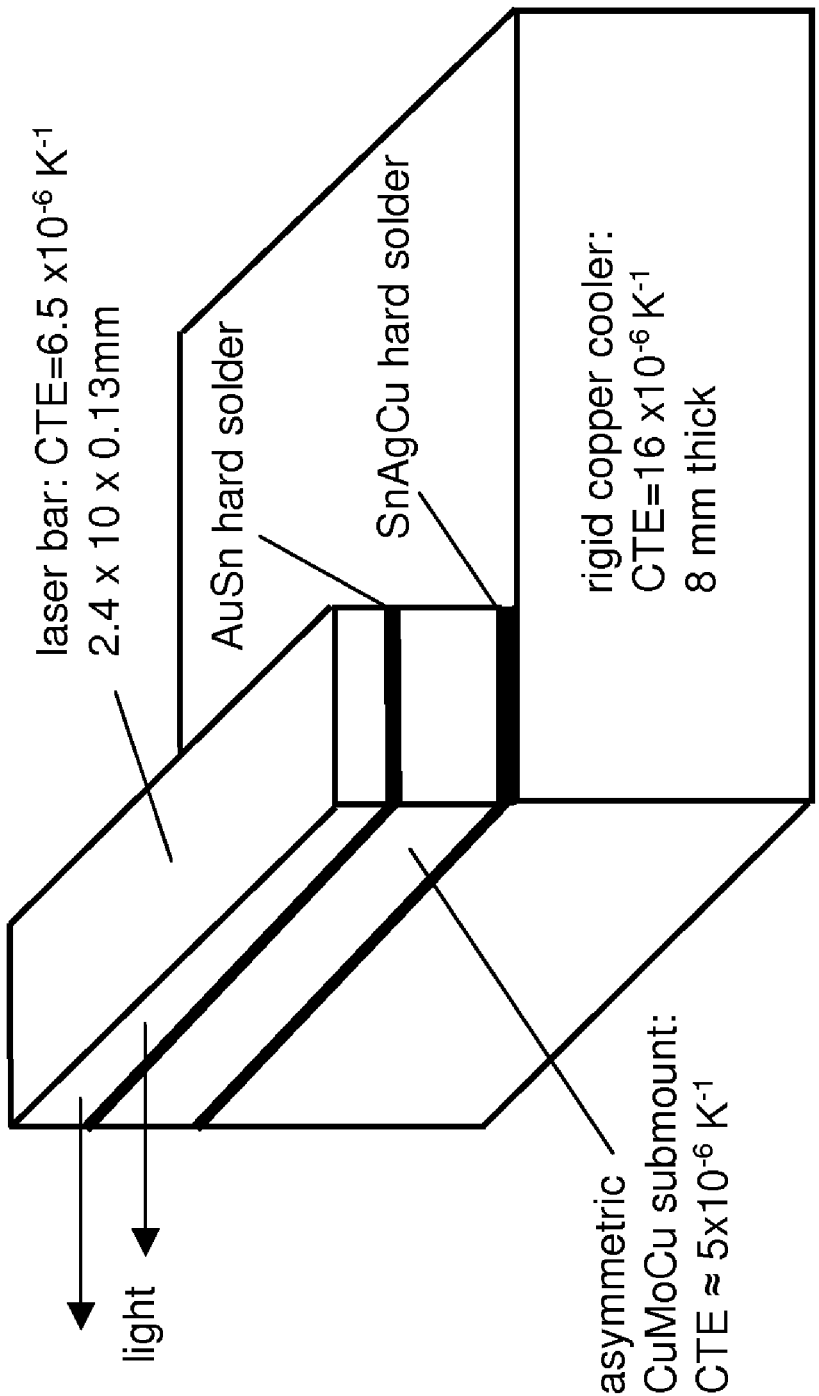
Figure 7A:
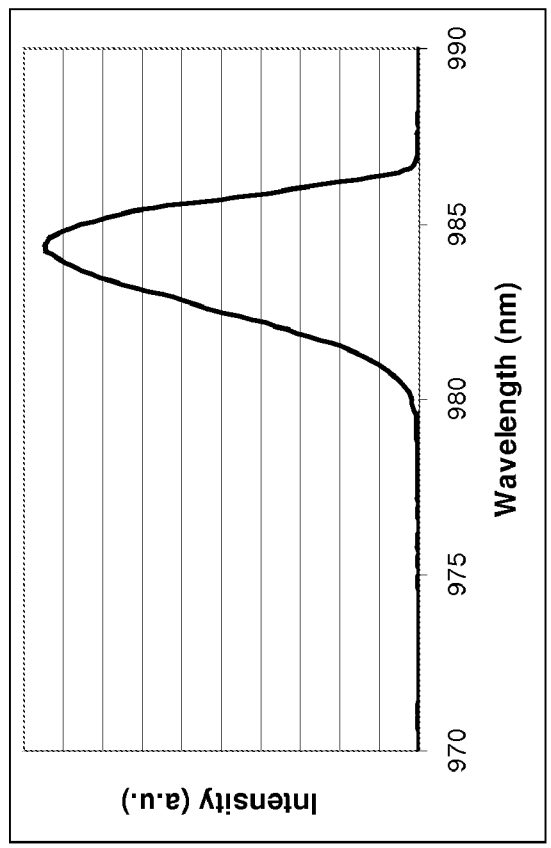
Figure 7B:
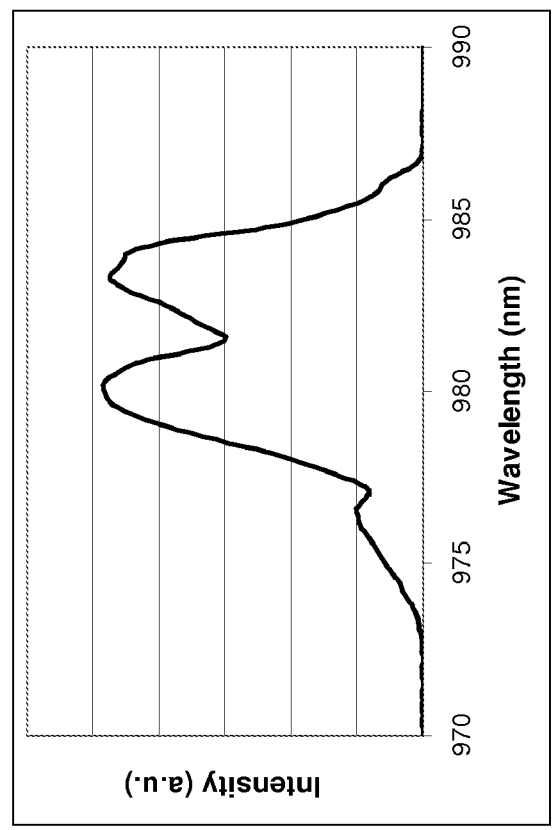
Figure 8A:
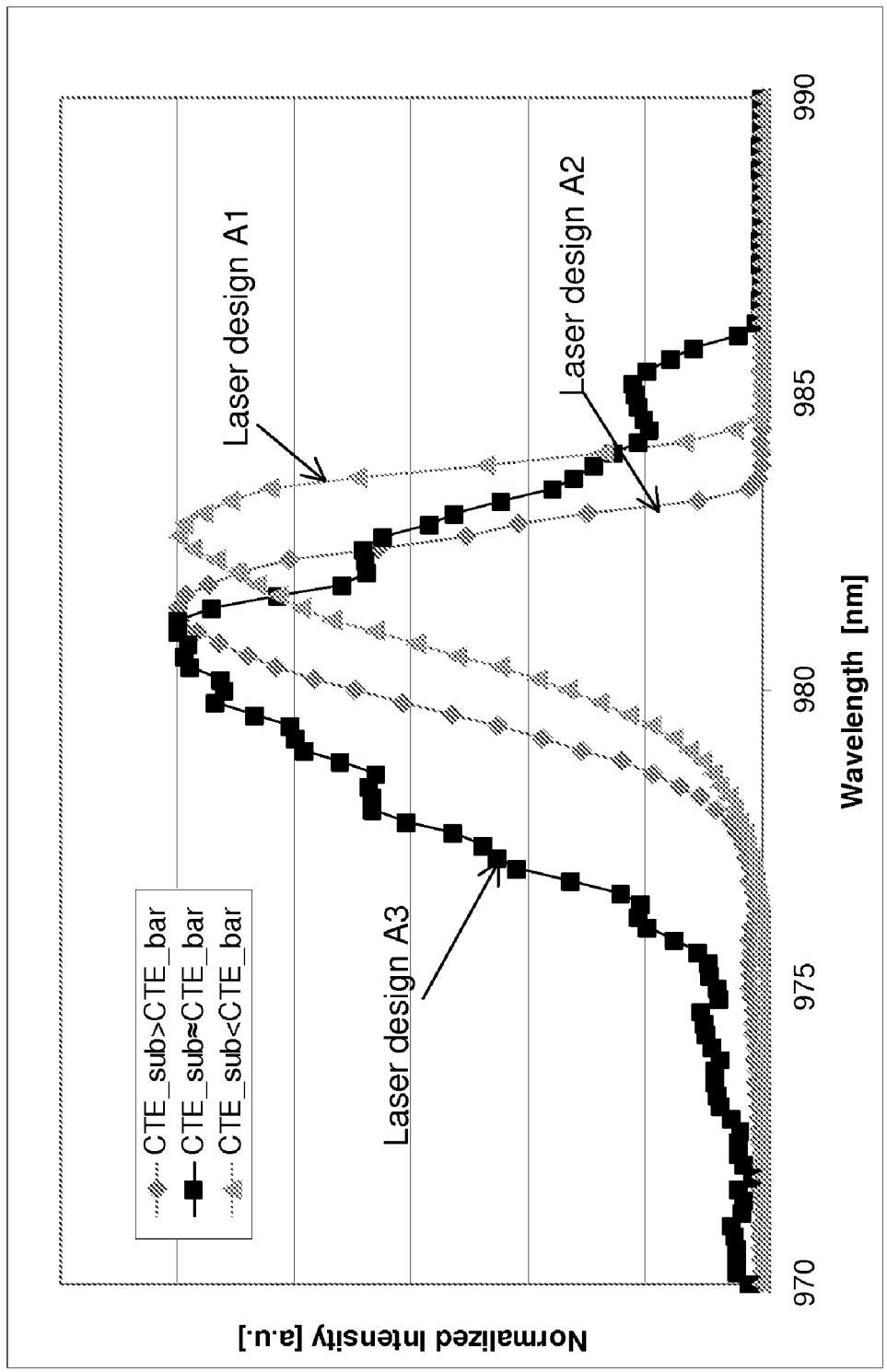
Figure 8C:
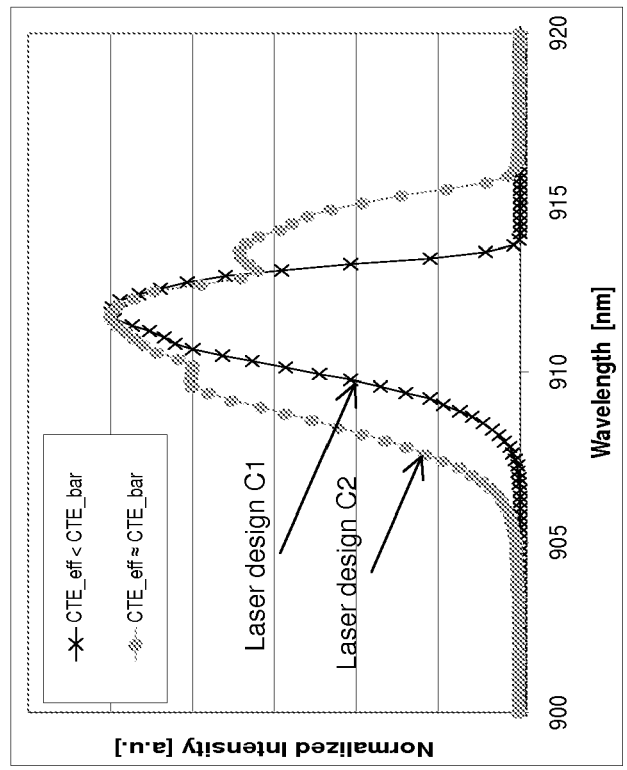
Figure 8B:
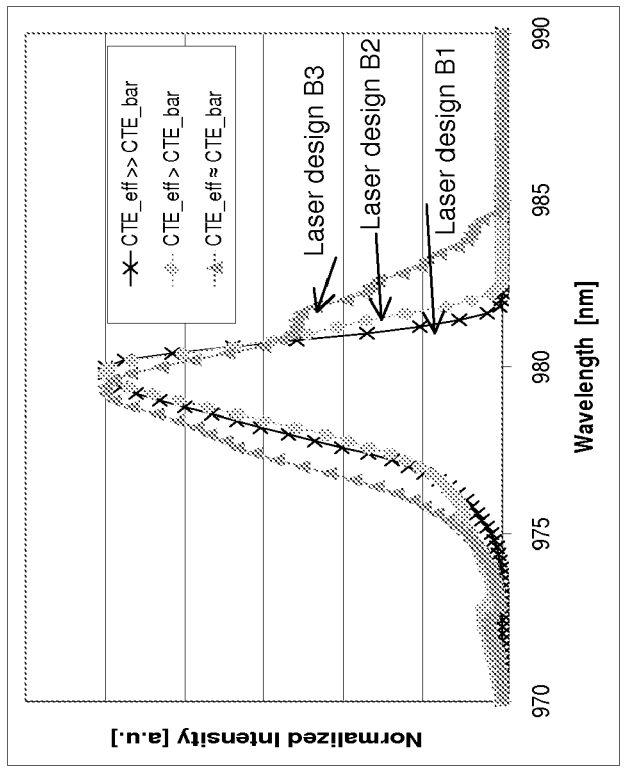
Figure 10B:
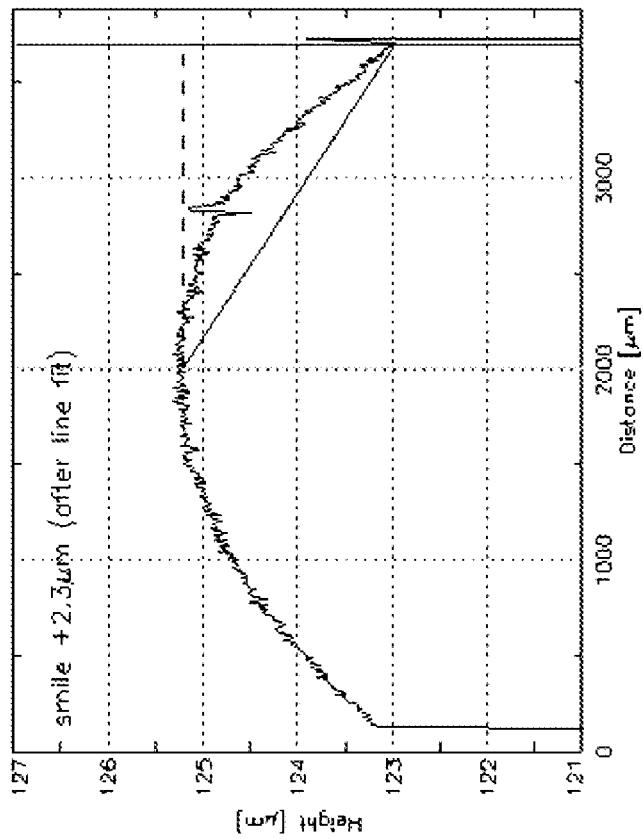
Figure 10A:
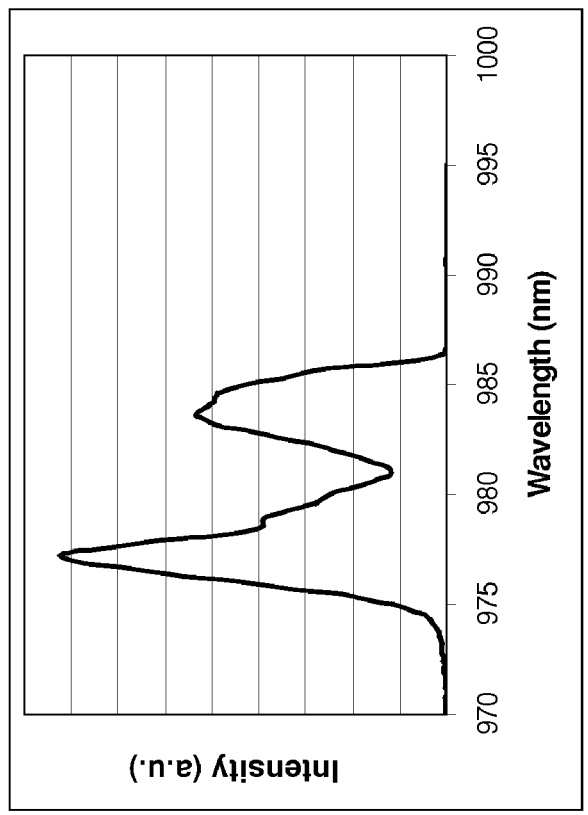
Figure 11B:
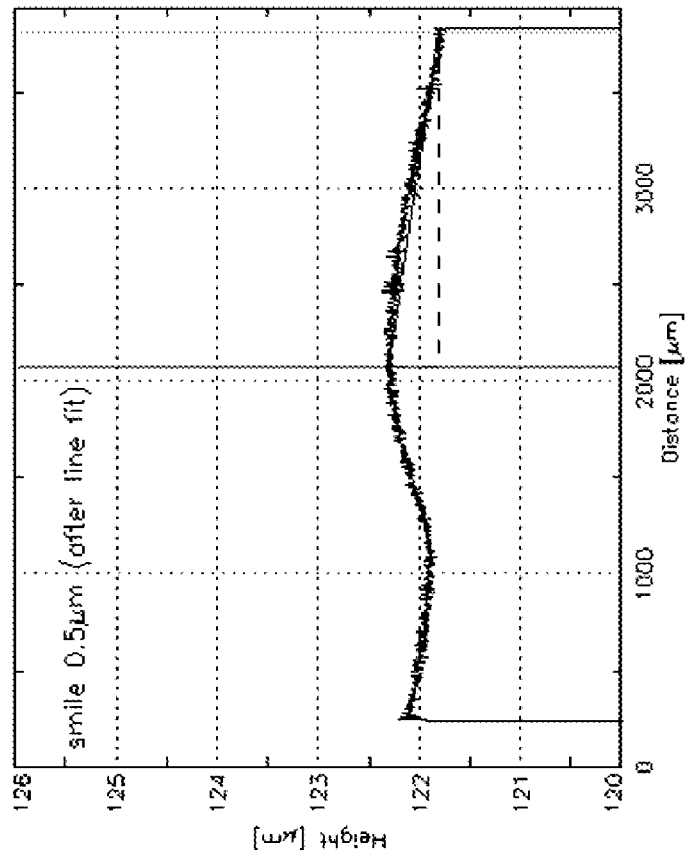
Figure 11A:
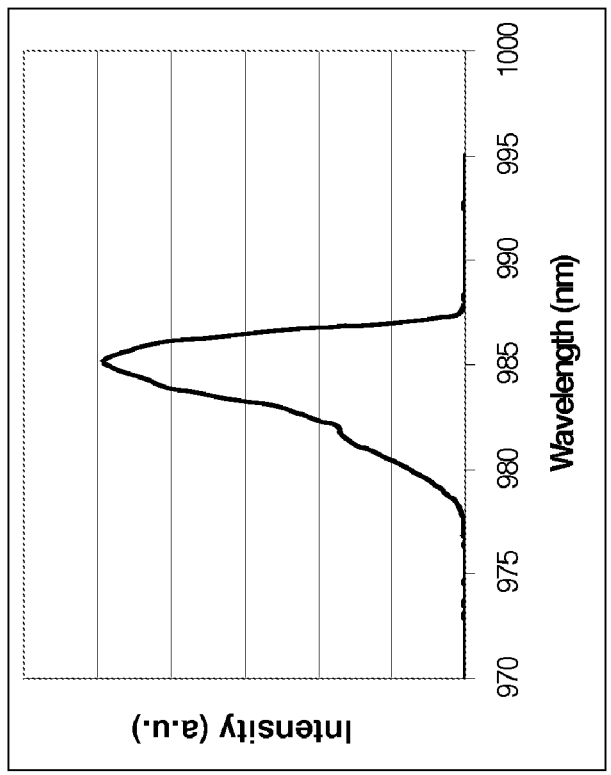
Figure 12B:
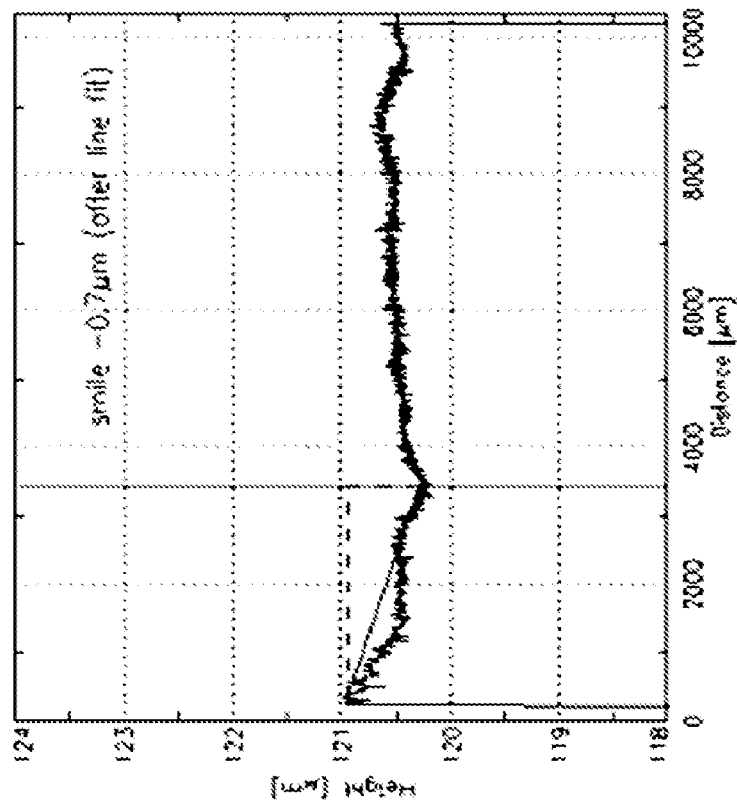
Figure 12A:
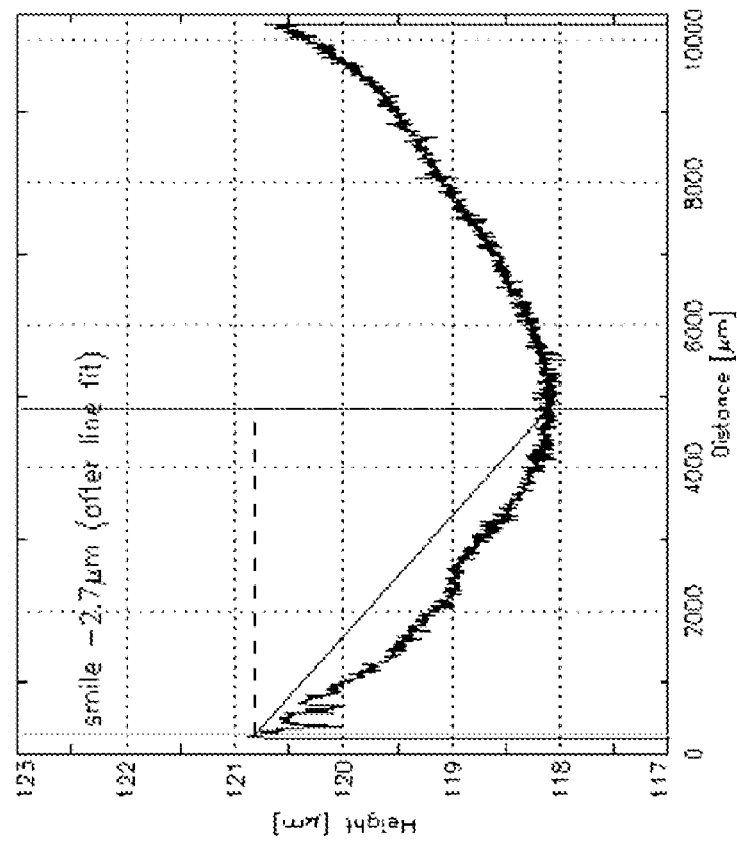
Figure 13:
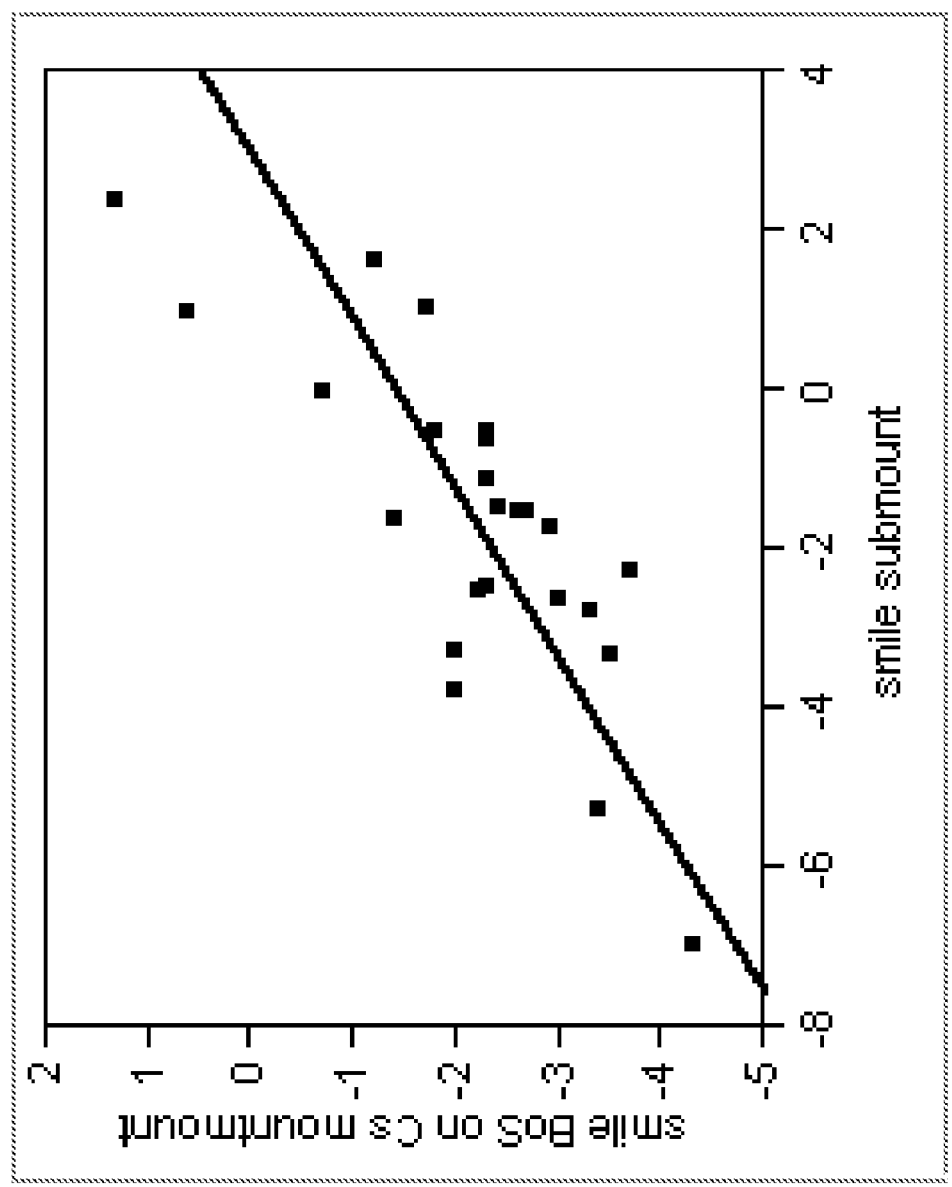

In the following, embodiments of the invention will be described by reference to the drawings, which show in:

FIG. 1a a schematic drawing of a laser bar/cooler structure with a soft solder, e.g. prior art technology (1);

FIG. 1b a schematic drawing of laser bar mounted on a CTE-matched submount using hard solder which submount is affixed to a copper cooler using a soft solder, e.g. technology (2a);

FIG. 1c a schematic drawing of laser bar mounted on a CTE-matched CuW submount and a copper cooler using hard solder on both interfaces, e.g. technology (2b);

FIG. 1d a schematic drawing of laser bar mounted on a "stress-tailored submount" according to the present invention, which submount is affixed to a copper cooler using hard solder on both interfaces;

FIG. 2 an enlarged general view of a typical embodiment of the present invention;

FIG. 3 a description of "bow" and "smile" of laser bars;

FIG. 4 a symmetric, layered submount according to the invention;

FIG. 5 an asymmetric, layered submount;

FIG. 6 a detailed view of a specific embodiment of the invention;

FIGS. 7a-7b a comparison of the spectral properties over the wavelength between a laser device made by a prior art technology (FIG. 7a) and a laser device made according to the invention (FIG. 7b);

FIGS. 8a-8c a more detailed comparison of the spectral properties between laser devices made by prior art technologies and laser devices designed according to the invention;

FIGS. 9a-9b a reliability comparison between laser devices made by a prior art technology (FIG. 9a) and laser devices designed according to the invention (FIG. 9b);

FIGS. 10a-10b the spectral behaviour and the smile shape and value of a laser device with a planar, CTE-matched submount according to the prior art ($CTE_{sub} = CTE_{bar}$);

FIGS. 11a-11b the spectral behaviour and the smile shape and value of a laser device with submount according to the invention ($CTE_{eff} < CTE_{bar}$);

FIGS. 12a-12b a comparison of smile values of two laser devices, one made with a planar submount with $CTE_{sub} < CTE_{eff}$ (FIG. 12a) and one assembled with a pre-bent submount and $CTE_{sub} < CTE_{eff}$ (FIG. 12b); and FIG. 13 the initial bow of a CuMoCu submount plotted versus the final bow of the laser device, illustrating the influence of the submount pre-bending on the final device smile.

FIGS. 1a-1c show three prior art embodiments of a laser diode bar on a massive copper cooler.

In the design shown in FIG. 1a, a laser bar is directly mounted to a copper cooler. Because of the large CTE difference between the laser bar and the cooler, $CTE_{bar} = 6.5 \times 10^{-6} K^{-1}$ versus $CTE_{cooler} = 16 \times 10^{-6} K^{-1}$, the "soft solder technology (1)" described above is used to avoid overstressing the laser bar.

The design of in FIG. 1b differs in that it shows a CuW submount whose CTE matches the CTE of the laser bar, $CTE_{bar} = CTE_{sub} = 6.5 \times 10^{-6} K^{-1}$. This design, above specified as technology (2a), avoids any stress between laser bar and submount. The stress is so-to-speak transferred to the interface between submount and cooler where the same CTE difference exists as in technology (1), but between other parts of the device as in FIG. 1a. There, a soft solder is used to avoid overstressing.

FIG. 1c shows a prior art design which uses the same materials as the design of FIG. 1b, i.e. the CuW submount has about the same CTE as the cooler laser bar. However, the soft solder of FIG. 1b between submount and cooler is replaced by a hard solder as specified in technology (2b) above. This design has the disadvantage that, depending on epitaxial design as well as the geometrical properties of the cooler, the stress building up when the device cools down from soldering has a negative impact on parameters such as smile, spectral width, polarization purity and/or device reliability.

FIG. 1d depicts a design according to the invention. Here, the submount's $CTE_{sub}$ is selected such that the "combined" or "effective" $CTE_{eff}$ of the submount (with $CTE_{sub}$) and the cooling element (with $CTE_{cool}$) differs from the laser bar's $CTE_{bar}$ by a predetermined amount, i.e. at least 5%, preferably about at least 10%. In absolute numbers, the CTE difference should be at least $3-4 \times 10^{-7} K^{-1}$.

This predetermined difference, which exerts a stress on the laser bar, distinguishes the present invention from the prior art.

There are various ways according to the invention to achieve the predetermined difference between the $CTE_{eff}$ of the submount/cooler assembly and the $CTE_{bar}$ of the laser bar.

The first way is to select the submount's coefficient $CTE_{sub}$ higher than the laser bar's coefficient $CTE_{bar}$, $CTE_{sub} > CTE_{bar}$, and smaller than or equal to the cooler's coefficient $CTE_{cool}$, $CTE_{sub} \leq CTE_{cool}$.

The second way is to select the submount's coefficient $CTE_{sub}$ smaller than both the laser bar's coefficient $CTE_{bar}$ and the cooler's coefficient $CTE_{cool}$, $CTE_{sub} < CTE_{bar}$ and $CTE_{sub} < CTE_{cool}$.

Just to repeat the basic condition defined above: all coefficients are selected such that the $CTE_{eff} \neq CTE_{bar}$.

The submount can be a solid material, e.g. an alloy or a mixture of two or more materials. It can also be a layered structure of symmetric design as shown in FIG. 4 or of asymmetric design as shown in FIG. 5. For optimizing the smile and the optical properties, the submount may have a bow of up to 15 µm, caused by pre-bending and/or an asymmetric design. The smile values for a sample CuMoCu submount and an 2 mm copper cooler are shown in FIG. 10b. Typically the laser bar is first soldered to the submount using a hard solder process, e.g. AuSn, whose solidification temperature is typically 200-350° C. In a second solder process, the "bar on submount" is soldered to the copper cooler using another hard solder process. Alternatively, the two solder joints can be processed in one solder step, again using a hard solder process. Usually, the resulting thickness of the solder joints is 20 µm or less so that they hardly affect the physical behaviour of the device.

FIG. 2 displays essentially the same device as FIG. 1c in a three-dimensional "exploded" view. The laser bar is shown with the light emitting areas or facets of the laser diodes. It should also be noted that the laser bar differs from the copper cooler not only in its CTE, but also in its Young's modulus, i.e. its elasticity or E modulus, as shown in the figure. It should further be noted that the temperatures reached during assembly of the laser device exceed the average operating temperature by 150-300K.

FIG. 3 explains the meaning of the term "bow" or "smile" of a semiconductor laser device as used herein, whereby the transversal or lateral bending of the device is of interest. The direction of bending is described by either "a grumpy bow" with bow values greater than zero or as "smiley bow" with bow values less than zero.

Constructing the submount with a $CTE_{sub}$ that varies across the submount's thickness can be achieved in several ways. Such a submount will be called a "graded-CTE submount".

FIG. 4 shows a typical symmetric, layered design of a graded-CTE submount. An Mo substrate having a thickness of 300 µm and a $CTE_{subB} = 4.8 \times 10^{-6} K^{-1}$ is sandwiched between two 15 µm Cu layers having a $CTE_{subA} = 16 \times 10^{-6} K^{-1}$. The two Cu layers may be plated or otherwise applied onto the Mo substrate. A submount of this structure and with these dimensions has a resulting $CTE_{sub}$ of about $5 \times 10^{-6} K^{-1}$. FIG. 6 shows a corresponding laser device in detail. The components are joined by two different hard solders, a SnAgCu and an AuSn hard solder, using soldering temperatures between 200-350° C. The thickness of each solder joint is about 20 µm or less.

Another way for constructing a graded-CTE submount is to build it of just two different layers, a first layer with a $CTE_{subA}$ and a second layer with $CTE_{subB}$, $CTE_{subB}$ being different from, preferably greater than, $CTE_{subA}$, whereby the first layer is to be located adjacent the laser bar and the second layer is to be located adjacent the cooling element. Such a submount is shown in FIG. 5, depicting a typical asymmetric, layered design of a "graded-CTE" submount. A Mo substrate of 200 µm carries a Cu layer of 20 µm on only one side, which is the one to be soldered to the cooler. The resulting $CTE_{sub}$ is in the range of 5 . . . $6 \times 10^{-6} K^{-1}$.

There are many other ways of constructing such a graded-CTE submount; one more being shown and described in connection with FIG. 6.

FIG. 6 is a schematic drawing of an assembled laser device according to the invention using a graded-CTE submount. The dimensions of the laser diode bar are 10 mm×2.4 mm×0.15 mm and its $CTE_{bar} = 6.5 \times 10^{-6} K^{-1}$.

The layered, asymmetric CuMoCu submount is 330 µm thick and consists of a first Cu layer of 10 µm on top which faces the laser bar. The center part is a Mo substrate of 300 µm, and a second Cu layer of 20 µm is placed at the bottom facing the cooler. This submount structure results in a $CTE_{sub}$ of about $5 \times 10^{-6} K^{-1}$. The cooler is a rather rigid block of Cu of 8 mm thickness. Both solder interfaces are made with a hard solder process, the laser/submount interface with an AuSn hard solder, the cooler/submount interface with a SnAgCu hard solder. Please note that all implementations of the invention show the use of hard soldering.

The copper cooler can be either a rigid block, or it can have an inner structure consisting of one or more water channels. The thickness range of the cooler is typically 1 to 10 mm.

FIGS. 7a and 7b compare wavelength measurements of two laser devices. A first laser device was manufactured with a prior art technology, here technology (2b), shown in FIG. 1c, using a CTE-matched CuW submount and two hard solder processes on a 8 mm Cu cooler. FIG. 7a shows the measured results of this first laser device with a multi-peak characteristic and a rather broad spectral width. The latter makes it unsuitable for many applications.

The other laser device was made according to the invention as shown and described in connection with FIG. 6. FIG. 7b shows the result: a clean, single-peak output and a small spectral width.

FIGS. 8a to 8c show and compare spectral properties of various submount designs in more detail than the previous FIGS. 7a and 7b, i.e the influence of the value of $CTE_{sub}$ in relation to $CTE_{bar}$ indicated by the normalized laser beam plotted over the wavelength.

As mentioned above, a high power diode bar has a $CTE_{bar}$ much lower than that of the cooler. Typically a GaAs diode bar has a $CTE_{bar}=6.5\times10^{-6}K^{-1}$ compared with a usual copper cooler having $CTE_{cool}=16\times10^{-6}K^{-1}$. Also typically, the cooler is four to forty times thicker than the submount.

Given these starting ranges of values, the following examples illustrate how, according to the invention, the two remaining CTEs can be selected.

FIG. 8a shows the intensity-over-wavelength data of three laser designs, labeled A1, A2, and A3 below. All of them use the same laser bar.
Laser device design A1:
laser bar thickness, $d_{bar}=0.15$ mm, $CTE_{bar}=6.5\times10^{-6}K^{-1}$
submount thickness, $d_{sub}=0.4$ mm, $CTE_{sub}=5\times10^{-6}K^{-1}$
cooler thickness, $d_{cool}=2$ mm, $CTE_{cool}=16\times10^{-6}K^{-1}$.

Here, $CTE_{sub}$ of the submount is less than the $CTE_{bar}$ of the laser diode bar and the $CTE_{eff}$ is less than $CTE_{bar}$, i.e. $CTE_{eff}<CTE_{bar}$. The result is a tensile stress exerted onto the laser bar. This tensile stress, which can be verified by e.g. X-ray diffraction methods, results in an optimization of the electro-optical properties as will be shown.

As mentioned, FIG. 8a shows data derived from measuring three laser devices, one of them designed according to the above specifications A1, i.e. a laser device with tensile stress. The data indicate that it is obviously a "good" laser device. This FIG. 8a also depicts measured data of a second "good" laser device, design A2, also made according to the invention. Its characteristics are the following.
Laser device design A2:
laser bar thickness, $d_{bar}=0.15$ mm, $CTE_{bar}=6.5\times10^{-6}K^{-1}$
submount thickness, $d_{sub}=0.4$ mm, $CTE_{sub}=7.5\times10^{-6}K^{-1}$
cooler thickness, $d_{cool}=2$ mm, $CTE_{cool}=16\times10^{-6}K^{-1}$.

These values result in a strongly compressive stress exerted on the laser bar, i.e. $CTE_{sub}>CTE_{bar}$ and $CTE_{eff}>>CTE_{bar}$.

The third curve in FIG. 8a shows the data measured for a conventional design, here a "CTE-matched" structure with the following values:
Laser device design A3:
laser bar thickness, $d_{bar}=0.15$ mm, $CTE_{bar}=6.5\times10^{-6}K^{-1}$
submount thickness, $d_{sub}=0.4$ mm, $CTE_{sub}=6.5\times10^{-6}K^{-1}$
cooler thickness, $d_{cool}=2$ mm, $CTE_{cool}=16\times10^{-6}K^{-1}$.

Looking again at FIG. 8a, the comparison shows:
▲ Design A1: $CTE_{sub}<CTE_{bar}$, $CTE_{eff}<CTE_{bar}$, resulting polarization purity>50:1;
♦ Design A2: $CTE_{sub}>CTE_{bar}$, $CTE_{eff}>>CTE_{bar}$, resulting polarization purity>50:1;
■ Design A3: $CTE_{sub}=CTE_{bar}$, blurred and broad spectrum, resulting polarization purity<10:1.

To summarize, design A3, which follows design rules known from the prior art by choosing $CTE_{sub}=CTE_{bar}$, shows a blurred, broad spectrum, a rather poor polarization purity and a so-to-speak unpredictable shape. It is obviously the least desirable. There may be laser applications where this is unimportant, but for the plurality of applications, a better defined laser output is required.

Much better values are measured for the two designs A1 and A2, made according to the present invention, with $CTE_{eff}\neq CTE_{bar}$—either $CTE_{eff}<CTE_{bar}$ or $CTE_{eff}>CTE_{bar}$. Selecting $CTE_{sub}>CTE_{bar}$, $CTE_{eff}>>CTE_{bar}$ (A1 above) leads to a much more precise, narrow, and better defined laser output whose spectral maximum is close to the maximum for $CTE_{sub}\approx CTE_{bar}$ above. The polarization purity however of this configuration is 50:1 or more. Selecting $CTE_{sub}<CTE_{bar}$, $CTE_{eff}<CTE_{bar}$ (A2 above) also leads to a spectrally well defined, precise and narrow laser output whose maximum is shifted to longer wavelengths than for the two examples above. The polarization purity of this configuration is again 50:1 or more.

Another example is illustrated in FIG. 8b. It again shows the intensity-over-wavelength data of three laser designs, labeled B1, B2, and B3. All of them use the same laser bar.
Laser device design B1:
laser bar thickness, $d_{bar}=0.15$ mm, $CTE_{bar}=6.5\times10^{-6}K^{-1}$
submount thickness, $d_{sub}=0.4$ mm, $CTE_{sub}=7.5\times10^{-6}K^{-1}$
cooler thickness, $d_{cool}=8$ mm, $CTE_{cool}=16\times10^{-6}K^{-1}$.

Both, $CTE_{sub}$ of the submount as well as the $CTE_{cool}$ of the cooler are larger than the $CTE_{bar}$ of the laser diode. Thus the $CTE_{eff}$ is no doubt much larger than $CTE_{bar}$, i.e. $CTE_{eff}>>CTE_{bar}$. The result is a compressive stress exerted onto the laser bar. This compressive stress results in the optimization of electro-optical parameters such as a narrow spectral width and a high polarization purity.

The X-curve of FIG. 8b shows the measurements of this laser device with compressive stress, the other two with the CTE values shown. The other two laser devices whose curves are shown, are B2 and B3, data see below and in the legend of FIG. 8b. Device designs B1 to B3 have the same physical structure and measures as device design B1.
X: $CTE_{sub}=7.5\times10^{-6}K^{-1}$, resulting polarization purity>50:1;
O: $CTE_{sub}=6.5\times10^{-6}K^{-1}$, $CTE_{sub}=CTE_{bar}$, $CTE_{eff}>CTE_{bar}$ resulting polarization purity≈25:1;
Δ: $CTE_{sub}=5\times10^{-6}K^{-1}$, $CTE_{sub}<CTE_{bar}$, $CTE_{eff}=CTE_{bar}$, resulting polarization purity≈10:1.

This shows the much better performance, at least regarding the polarization purity, of design B1 as compared to the other two conventional designs B2 and B3 which follow the design rules of the prior art, i.e. select CTE values matching the laser bar's $CTE_{bar}$ (B2) or minimizing the stress in the laser (B3). In other words, though B1 is built with design characteristics contrary to the widely accepted general design rules, it shows better results.

All in all, it should be clear from the above and the corresponding figures that the relations $CTE_{sub}\approx CTE_{bar}$ and $CTE_{eff}\approx CTE_{bar}$—which relations appears logical and preferable at first sight and allows the use of a hard solder between the submount and the laser—are obviously not always preferable when a precise laser output is desired or required.

Please note that FIG. 8a shows the results based on the relation between $CTE_{sub}$ and $CTE_{bar}$, whereas FIG. 8b depicts measured results based on the relation between $CTE_{eff}$ and $CTE_{bar}$, $CTE_{eff}$ being the "combined" or "overall" CTE of the submount/cooler assembly as defined previously. Altogether are the characteristics of the three curves similar to those of the curves in FIG. 8a.

FIG. 8c finally depicts the results of two laser devices with two different $CTE_{eff}/CTE_{bar}$ ratios, here not only in another wavelength section than shown in FIG. 8b, but also comparing the relation $CTE_{eff}\approx CTE_{bar}$ with $CTE_{eff}<CTE_{bar}$, i.e. where the $CTE_{eff}$ is less than $CTE_{bar}$, resulting in a tensile stress exerted to the laser bar. Though the spectral maxima of the two curves are practically identical, the difference between the two curves in FIG. 8c is very pronounced. For the data see below and in the legend of FIG. 8c.
Laser device design C1:
laser bar thickness, $d_{bar}=0.15$ mm, $CTE_{bar}=6.5\times10^{-6}K^{-1}$
submount thickness, $d_{sub}=0.4$ mm, $CTE_{sub}=4.8\times10^{-6}K^{-1}$
cooler thickness, $d_{cool}=1.5$ mm, $CTE_{cool}=16\times10^{-6}K^{-1}$.
X: $CTE_{eff}<CTE_{bar}$, is a "tensile" design according to the invention. Its intensity/wavelength distribution shows a precise, narrow, and well defined laser output with good polarization purity (>50:1).

Laser device design C2:
laser bar thickness, $d_{bar}$=0.15 mm, $CTE_{bar}$=6.5×10$^{-6}$K$^{-1}$
submount thickness, $d_{sub}$=0.4 mm, $CTE_{sub}$=5.8×10$^{-6}$K$^{-1}$
cooler thickness, $d_{cool}$=1.5 mm, $CTE_{cool}$=16×10$^{-6}$K$^{-1}$.
O: $CTE_{eff} \approx CTE_{bar}$, is again a conventional design. The resulting polarization purity is ≈10:1 or less; the intensity/wavelength distribution is hardly useful for most applications since it is rather wide and blurred and the polarization purity is poor (<10:1).

It is obvious from FIGS. 8a-8c that both relations $CTE_{eff} \approx CTE_{bar}$ or $CTE_{sub} \approx CTE_{bar}$ are the least desirable and that $CTE_{eff} \neq CTE_{bar}$ provides significantly better results, no matter whether $CTE_{eff} > CTE_{bar}$ or even $CTE_{eff} >> CTE_{bar}$ or $CTE_{eff} < CTE_{bar}$. The measurements indicate also that the relation between $CTE_{eff}$ and $CTE_{bar}$ is the decisive relation— and not the relation between $CTE_{sub}$ and $CTE_{bar}$ as previously believed. The latter is one significant finding with regard to the present invention. Also, minimizing the assembly stress does not necessarily lead to the desired results. Much better results are achieved by controlling and/or adjusting the assembly stress.

FIGS. 9a and 9b compare reliability data between two groups of laser devices, D1 and D2 with the following characteristics.
Laser device design D1:
laser bar thickness, $d_{bar}$=0.15 mm, $CTE_{bar}$=6.4×10$^{-6}$K$^{-1}$;
submount thickness, $d_{sub}$=0.4 mm, $CTE_{sub}$=6.4×10$^{-6}$K$^{-1}$, graded, symmetric;
cooler thickness, $d_{cool}$=8 mm, $CTE_{cool}$=16×10$^{-6}$K$^{-1}$.

Design D1 was built according a conventional technology (2b), shown basically in FIG. 1c, using a CTE-matched CuW submount, $CTE_{sub} \approx CTE_{bar}$, and two hard solder processes on a 8 mm Cu cooler. The reliability test results in FIG. 9a show an early degradation with an operation current for 20 W output, probably because of stress-induced emitter failures. Design D2 uses a graded symmetric CuMoCu submount, similar to the submount shown in FIG. 4.
Laser device design D2:
laser bar thickness, $d_{bar}$=0.15 mm, $CTE_{bar}$=6.4×10$^{-6}$K$^{-1}$
submount thickness, $d_{sub}$=0.4 mm, $CTE_{sub}$=5.5×10$^{-6}$K$^{-1}$, graded, symmetric;
cooler thickness, $d_{cool}$=8 mm, $CTE_{cool}$=16×10$^{-6}$K$^{-1}$.

The devices of the second group were built according to the invention, as shown and described in connection with FIG. 6, i.e. with a submount having a $CTE_{sub}$ of about 5.5×10$^{-6}$ K$^{-1}$, resulting in $CTE_{eff} > CTE_{bar}$. The reliability test result of this second group is shown in FIG. 9b: a 2500 h life test with no or only little degradation of the operation current for 20 W output power. This again is a striking example that $CTE_{sub} \neq CTE_{bar}$ provides a far better solution with respect to reliability than $CTE_{sub} \approx CTE_{bar}$.

FIGS. 10a and 10b illustrate the spectral distribution and the bow of a laser device with a planar CuW submount with $CTE_{sub}$=$CTE_{bar}$, assembled using a hard solder technology on an 2.5 mm thick copper micro channel cooler. The spectral distribution illustrated in FIG. 11a with its breadth and double peak is far from desirable for many applications. So is the bow of this device, depicted in FIG. 11b, which is mainly determined by the CTE and thickness difference between cooler and submount. A positive smile or bow value stands for a "smiley", a negative bow value for a "grumpy" shape of the emitter line as described in FIG. 3. The positive, "grumpy", smile with 2.3 µm height is close to the values obtained for this configuration by finite element modeling of the solder process.

FIGS. 11a and 11b show values of a laser device according to the invention, constructed with a laser diode bar of 3.6 mm×3.6 mm×0.13 mm hard soldered to a Mo submount with $CTE_{sub}$=4.8×10$^{-6}$K$^{-1}$. FIG. 12a shows the spectral behaviour of this laser device, displaying a single peak and a rather narrow bandwidth. The smile of this laser device is depicted in FIG. 12b; it is less than 1 µm, rather close to 0.5 µm. The low smile value is achieved by first soldering the bar to the submount and then mounting the bar-on-submount component to the cooler, taking advantage of the CTE difference between the Mo submount and the bar. Because of this CTE mismatch, the bar-on-submount assembly shows a pre-bending in form of a "negative smile". This cannot be achieved for a bar soldered onto a planar CTE-matched submount as used in the prior art design described above in connection with FIG. 10. The negative bar-on-submount smile compensates for the bow caused by the second solder step, during which the bar-on-submount component is bent towards the "grumpy" direction.

The influence of pre-bending the submount (instead of the bar-on-submount) on the laser device smile is illustrated in FIGS. 12 and 13. FIGS. 12a and 12b depict a comparison of smile or bow values of two complete laser devices, in both cases mounted on a rigid, about 8 mm thick Cu block as cooler. FIG. 12a shows the values for a structure with a planar symmetric submount according to FIG. 4, soldered using a hard solder. The bow of the mounted device exceeds −2 µm, indicating that a pre-bending of the submount by +2-3 µm might improve the smile values significantly. FIG. 12b shows the smile values for an essentially identical (except for the submount) laser device having an asymmetric submount with $CTE_{sub} < CTE_{bar}$, e.g. according to FIG. 5 and being hard soldered to the thick copper cooler: the maximum smile in this case is less than 1 µm. For this configuration, the pre-bend submount has a smile of 2 µm grumpy, while the symmetric submount related to the smile displayed in FIG. 12a is more or less planar. A correlation between final devices smile and pre-bending is shown in FIG. 13 for bars assembled on CuMoCu submounts with CTE values of 5-5.5×10$^{-6}$K$^{-1}$ and a rigid Cu cooler using a hard solder technology.

Additional advantages and modifications will readily occur to persons skilled in the art and the invention is therefore not limited to the specific embodiments, details, and steps shown and described hereinbefore. Modifications may be made without departing from the spirit and scope of the general inventive concepts as defined in the appended claims.

The invention claimed is:
1. A laser source of more than one W for generating light at a desired wavelength, said laser source comprising a bar of semiconductor laser diodes with an active region, a submount onto which said laser bar is affixed, and a cooling element onto which said submount is affixed, said submount/cooling element constituting a submount/cooler assembly,
   said laser bar has a first coefficient of thermal expansion ($CTE_{bar}$),
   said submount has a second coefficient of thermal expansion ($CTE_{sub}$),
   said cooling element has a third coefficient of thermal expansion ($CTE_{cool}$), and
   said submount/cooler assembly has an effective fourth coefficient of expansion ($CTE_{eff}$)
   wherein
   said active region's semiconductor crystal lattice is deformed by mechanical stress executed upon said laser bar by said submount/cooler assembly.

2. The laser source according to claim 1, wherein the submount/cooler assembly has a fourth coefficient ($CTE_{eff}$) different from the laser bar's first coefficient ($CTE_{bar}$), $CTE_{eff} \pm CTE_{bar}$, the difference being at least 5%, effecting a deformation of the crystal lattice of at least about 0.01%.

3. The laser source according to claim 2, wherein the fourth coefficient ($CTE_{eff}$) differs from the first coefficient ($CTE_{bar}$) by an amount of between 5% and 100%.

4. The laser source according to claim 1, wherein the second coefficient ($CTE_{sub}$) is selected higher than said first coefficient ($CTE_{bar}$) and smaller than or equal to said third coefficient ($CTE_{cool}$): $CTE_{sub} > CTE_{bar}$ and $CTE_{sub} \leq CTE_{cool}$.

5. The laser source according to claim 1, wherein the second coefficient ($CTE_{sub}$) is selected less than both said first coefficient ($CTE_{bar}$) and said third coefficient ($CTE_{cool}$): $CTE_{sub} < CTE_{bar}$ and $CTE_{sub} < CTE_{cool}$.

6. The laser source according to claim 1, wherein the second coefficient ($CTE_{sub}$) is constant across the submount's thickness.

7. The laser source according to claim 1, wherein the second coefficient ($CTE_{sub}$) varies across the submount's thickness.

8. The laser source according to claim 1, wherein the submount consists of or comprises at least two layers of different materials having different CTEs, resulting in a second coefficient ($CTE_{sub}$) which varies across the submount's thickness.

9. The laser source according to claim 8, wherein a first layer of the submount has a $CTE_{subA}$ and a second layer has a $CTE_{subB}$, $CTE_{subB}$ being different from, preferably greater than, $CTE_{subA}$, said first layer being located adjacent the laser bar and said second layer being located adjacent the cooling element.

10. The laser source according to claim 8, wherein the first layer of the submount is Cu of about 10-40 μm, preferably 20 μm, thickness and the second is Mo of about 100-400 μm, preferably 200 μm, thickness.

11. The laser source according to claim 8, wherein the submount consists of three layers, a first Cu layer of about 10-40 μm, preferably 15 μm, thickness, a Mo layer of about 100-400 μm, preferably 300 μm, thickness, and a second Cu layer of about 20-40 μm, preferably 15 μm, thickness.

12. The laser source according to claim 1, wherein both the laser bar and the cooling element are hard soldered to the submount, preferably using an AuSn hard solder and/or an SnAgCu hard solder.

13. The method of making a device according to claim 1.

* * * * *